(12) United States Patent
Tanaka

(10) Patent No.: US 7,476,629 B2
(45) Date of Patent: Jan. 13, 2009

(54) BEAM IRRADIATION APPARATUS, BEAM IRRADIATION METHOD, AND METHOD FOR MANUFACTURING THIN FILM TRANSISTOR

(75) Inventor: Koichiro Tanaka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 625 days.

(21) Appl. No.: 10/827,402

(22) Filed: Apr. 20, 2004

(65) Prior Publication Data

US 2004/0209410 A1    Oct. 21, 2004

(30) Foreign Application Priority Data

Apr. 21, 2003  (JP) .............................. 2003-116392

(51) Int. Cl.
  *H01L 21/00*  (2006.01)
(52) U.S. Cl. ................. 438/795; 438/151; 257/E21.561
(58) Field of Classification Search ......... 438/149–151, 438/795; 257/E21.411, E21.561
  See application file for complete search history.

(56) References Cited

U.S. PATENT DOCUMENTS

| | | | |
|---|---|---|---|
| 4,330,363 A | 5/1982 | Biegesen et al. | |
| 4,439,245 A | 3/1984 | Wu | |
| 4,504,354 A | 3/1985 | George et al. | |
| 5,365,875 A | 11/1994 | Asai et al. | |
| 5,712,191 A | 1/1998 | Nakajima et al. | |
| 5,756,364 A | 5/1998 | Tanaka et al. | |
| 5,815,494 A | 9/1998 | Yamazaki et al. | |
| 5,835,249 A | 11/1998 | Yamada et al. | |
| 5,854,803 A | 12/1998 | Yamazaki et al. | |
| 5,893,990 A | 4/1999 | Tanaka | |
| 5,896,233 A | 4/1999 | Soda et al. | |
| 5,932,118 A | 8/1999 | Yamamoto et al. | |
| 6,087,277 A | 7/2000 | Shih et al. | |
| 6,156,997 A | 12/2000 | Yamazaki et al. | |

(Continued)

FOREIGN PATENT DOCUMENTS

JP           01-146320           6/1989

(Continued)

OTHER PUBLICATIONS

Specification, claims, abstract of U.S. Appl. No. 10/820,781 filed Apr. 9, 2004.

*Primary Examiner*—Bradley K Smith
(74) *Attorney, Agent, or Firm*—Eric J. Robinson; Robinson Intellectual Property Law Office, P.C.

(57) ABSTRACT

The speed of the laser scanned with the scanning means such as a galvanometer mirror or the polygon mirror is not constant in the center portion and in the end portion of the scanning width. As a result, the object to be irradiated is irradiated with the excessive energy and thereby there is a risk that the amorphous semiconductor film may be peeled.

In the case of scanning the spot of the energy beam output continuously with the scanning means, the present invention is to block the CW beam irradiated to the regions in the object to be irradiated where the scanning speed of the spot accelerates, decelerates, and it becomes zero, that is to say, when the spot is in the position where the scanning starts and in the position where the scanning ends.

21 Claims, 5 Drawing Sheets

U.S. PATENT DOCUMENTS

| | | |
|---|---|---|
| 6,235,614 B1 | 5/2001 | Yang |
| 6,246,524 B1 | 6/2001 | Tanaka |
| 6,274,414 B1 | 8/2001 | Ogata et al. |
| 6,322,625 B2 | 11/2001 | Im |
| 6,341,042 B1 | 1/2002 | Matsunaka et al. |
| 6,429,100 B2 | 8/2002 | Yoneda |
| 6,495,405 B2 | 12/2002 | Voutsas et al. |
| 6,506,635 B1 * | 1/2003 | Yamazaki et al. ............ 438/148 |
| 6,528,758 B2 | 3/2003 | Shaffer |
| 6,534,744 B1 | 3/2003 | Yamazaki et al. |
| 6,563,077 B2 | 5/2003 | Im |
| 6,573,163 B2 | 6/2003 | Voutsas et al. |
| 6,700,096 B2 * | 3/2004 | Yamazaki et al. ...... 219/121.73 |
| 6,737,306 B2 | 5/2004 | Yamazaki et al. |
| 6,770,546 B2 | 8/2004 | Yamazaki |
| 6,777,276 B2 | 8/2004 | Crowder et al. |
| 6,797,550 B2 | 9/2004 | Kokubo et al. |
| 6,818,568 B2 | 11/2004 | Tanaka |
| 6,821,343 B2 | 11/2004 | Hara et al. |
| 6,849,825 B2 | 2/2005 | Tanaka |
| 6,897,889 B2 | 5/2005 | Tanaka |
| 6,984,573 B2 | 1/2006 | Yamazaki et al. |
| 7,078,281 B2 | 7/2006 | Tanaka et al. |
| 7,112,517 B2 | 9/2006 | Tanaka et al. |
| 6,982,396 B2 | 11/2006 | Yamazaki et al. |
| 7,164,152 B2 | 1/2007 | Im |
| 7,220,627 B2 * | 5/2007 | Yamazaki et al. ............ 438/166 |
| 7,259,082 B2 | 8/2007 | Tanaka |
| 2002/0031876 A1 | 3/2002 | Hara et al. |
| 2003/0047732 A1 | 3/2003 | Yamazaki et al. |
| 2003/0166315 A1 | 9/2003 | Tanada et al. |
| 2003/0224587 A1 | 12/2003 | Yamazaki et al. |
| 2004/0074881 A1 | 4/2004 | Oishi |
| 2004/0106237 A1 | 6/2004 | Yamazaki |
| 2004/0140297 A1 | 7/2004 | Tanaka et al. |
| 2004/0266223 A1 | 12/2004 | Tanaka et al. |
| 2005/0036190 A1 | 2/2005 | Tanaka |
| 2005/0037552 A1 * | 2/2005 | Yamazaki et al. ............ 438/166 |
| 2005/0245007 A1 * | 11/2005 | Azami et al. ................ 438/150 |
| 2005/0277028 A1 * | 12/2005 | Yamazaki et al. .............. 430/4 |

FOREIGN PATENT DOCUMENTS

| | | |
|---|---|---|
| JP | 01-276621 | 11/1989 |
| JP | 07-326769 | 12/1995 |
| JP | 09-270393 | 10/1997 |
| JP | 11-354463 | 12/1999 |
| JP | 2000-058478 | 2/2000 |
| JP | 2001-074950 | 3/2001 |
| JP | 2001-156017 | 6/2001 |
| JP | 2003-045890 | 2/2003 |
| JP | 2003-059831 | 2/2003 |
| JP | 2003-086505 | 3/2003 |
| JP | 2003-086507 | 3/2003 |

* cited by examiner

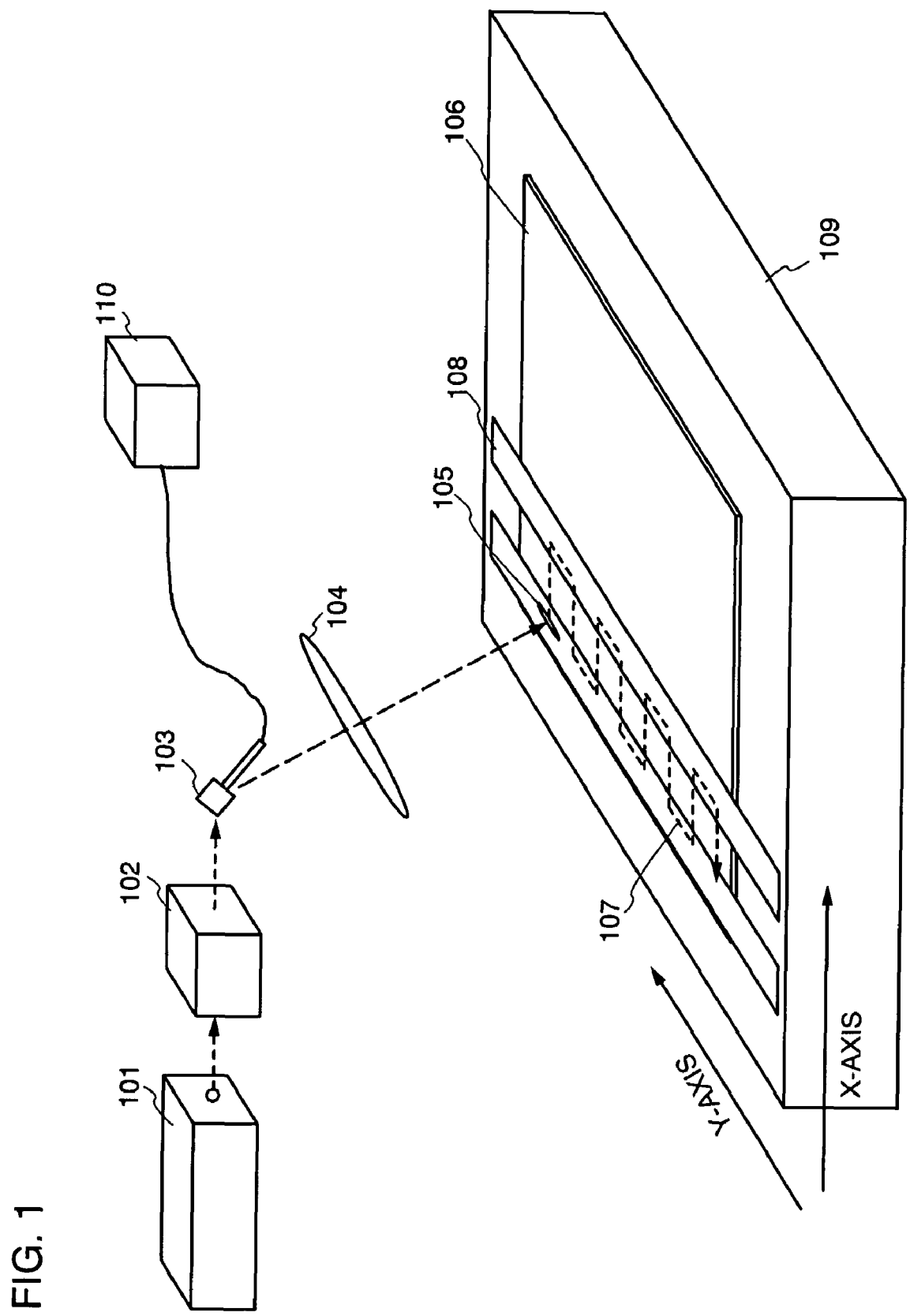

Y-AXIS
X-AXIS

PROCESSED REGION
NON-PROCESSED REGION

SPEED OF LASER SPOT

BEAM IRRADIATION APPARATUS, BEAM IRRADIATION METHOD, AND METHOD FOR MANUFACTURING THIN FILM TRANSISTOR

BACKGROUND OF THE INVENTION

1. Field of the Invention

The present invention relates to a beam irradiation apparatus and a beam irradiation method. Moreover, the present invention relates to a method for manufacturing a thin film transistor using the beam irradiation apparatus and the beam irradiation method.

2. Related Art

The research has been conducted on a thin film transistor having a poly-crystalline semiconductor film in its channel-forming region (hereinafter referred to as a poly-crystalline TFT) as a semiconductor element included in a display device, an integrated circuit, or the like. With the development of the display device and the integrated circuit, further enhancement of the characteristic of the poly-crystalline TFT is expected.

Consequently, in order to enhance the characteristic of the poly-crystalline TFT, crystallization of the semiconductor film by continuous wave (CW) laser light is examined. For example, there is a method for crystallizing an amorphous Si film in such a way that after the amorphous Si film is patterned to be linear or island-shaped over the glass substrate, an energy beam output from a CW laser oscillator continuously to time is irradiated to crystallize the amorphous Si film (refer to patent document 1). The patent document 1 describes that when the semiconductor thin film is patterned into linear or island-shaped in advance, the temperature of the glass substrate does not rise and therefore the crack or the like can be prevented. In addition, the patent document 1 also describes that a blocking plate with an opening provided is used to crystallize only the necessary part of the amorphous Si film selectively without giving damage to the glass substrate and without peeling the film with reference to FIG. 29 and FIG. 31.

In addition, a galvanometer mirror (refer to patent document 2) or a polygon mirror (refer to patent document 3) is used as means for scanning (also referred to as deflecting) the laser light (also described to as a laser beam). Since the galvanometer mirror and the polygon mirror can easily increase the scanning speed, it is possible to reduce the burden on the irradiation apparatus.

[Patent document 1]
  Japanese Patent Application Laid-open No. 2003-86505
[Patent document 2]
  Japanese Patent Application Laid-open No. 2003-86507
[Patent document 3]
  Japanese Patent Application Laid-open No. 2003-45890

When the CW laser light as described above is irradiated to the substrate using the galvanometer mirror or the polygon mirror, a scanning width is limited. Therefore, it is necessary to repeat the scanning of the laser light for multiple times and there is the region where the scanning of the laser light stops. Such a region makes it difficult to perform the laser processing uniformly.

The galvanometer mirror and the like are originally built in the apparatus for marking. In such an application, the fact that the scanning of the laser light stops has not become a problem.

Moreover, the speed of the laser light scanned with the scanning means such as the galvanometer mirror or the polygon mirror is not constant in the center portion and in the end portion of the scanning width. For example, the laser light made to move back and forth in one direction by a galvanometer mirror decelerates toward a region where the direction of the back-and-forth movement changes (the point in which the galvanometer mirror stops) and its scanning speed becomes zero at last and then it is accelerated. In such a region where the scanning speed decelerates, accelerates, and becomes zero, the irradiation time becomes longer so that the object to be irradiated is irradiated with excessive energy. As a result, there is a risk that the amorphous semiconductor film is peeled and the like. It is concerned that when the film is peeled, the peeled film is spattered to the normal film, which results in the roughness of the normal film. Thus, it is a problem in the field of semiconductor that the scanning speed of laser light is not constant.

On the other hand, although the scanning speed does not become zero when the polygon mirror is employed, the scanning speed is not constant yet in the center portion and in the end portion of the scanning width. As a result, there is also a risk, as well as the galvanometer mirror, that the amorphous semiconductor film is peeled and the like.

As above, there is room for improvement in order to irradiate uniform CW laser light. Particularly when a large-sized substrate and mass production are taken into account, there are many points to be improved.

SUMMARY OF THE INVENTION

Conversely, it is an object of the present invention to solve the problem in the end portion of the laser irradiation in the case to irradiate the laser light with the galvanometer mirror or the polygon mirror. In particular, the object of the present invention is to provide a laser irradiation apparatus and a laser irradiation method for irradiating the object to be irradiated with the uniform laser light in consideration of the large-sized substrate and the mass production. Furthermore, it is also an object of the present invention to perform uniform laser processing, that is, laser annealing (including crystallization and activation) to a thin film transistor (hereinafter referred to as TFT) using the laser irradiation apparatus and the laser irradiation method as above.

In the present invention in view of the above problem, in the case where the beam spot (irradiated region) of the energy beam output continuously (referred to as a CW beam, which is specifically referred to as a CW laser when a laser is used as the light source) on the object to be irradiated is scanned in such a way that the spot is moved back and forth with the scanning means (deflecting means) or the like, the CW beam is blocked (light-blocked) in the range where the scanning speed (moving speed) of the spot is not the predefined value, that is to say, where the scanning speed thereof is not constant. The scanning speed (moving speed) of the beam spot that is not the predefined value means the speed that is not constant, for example the speed when it is accelerated, decelerated, and when it is zero. It is noted that the region where the speed is not constant and the speed accelerates, decelerates, or becomes zero means the position in which the scanning starts (one end) and the position in which the scanning ends (the other end). In other words, the present invention has light-blocking means arranged in the range where the scanning speed of the spot is not constant.

A light-blocking plate may be used as the light-blocking means. The light-blocking means can have a reflector for reflecting the laser beam or an absorber for absorbing the laser beam in its structure. In addition, the shape of the light-blocking plate can be set appropriately provided that the object to be irradiated is not irradiated with the range of the beam spot that is not scanned at a constant speed. Moreover, since it is not necessary to fix the light-blocking means, the light-blocking means may be arranged so as to light-block in synchronization with the scanning means, and a chopper may be used as the light-blocking means.

As the scanning means, a specular body (also referred to as a mirror) changing an incident position of the laser beam to the object to be irradiated, for example means having one or a plurality of specular bodies, means having a plurality of specular bodies arranged continuously, or means having the other specular body can be used. The galvanometer mirror and the polygon mirror are given as the specific scanning means. In addition, the specular body having a plane surface or a curved surface which is fixed on the shaft and which is turned (including rotation and vibration) using the shaft as its center may be also employed as the other scanning means. On this occasion, the shaft has means for controlling the turning of the specular body provided in one end or the opposite ends thereof. Controlling the turning indicates to control the rotational speed and the like in the case of rotation and to control the amplitude of vibration and the like in the case of vibration. In addition, when a plurality of the specular bodies are provided, reflection condition in each of the plurality of specular bodies may be different. Taking it into account, it is preferred to employ one specular body.

It is noted that when the galvanometer mirror or the polygon mirror is used, the time required for the acceleration or the deceleration is short in spite of the considerably high scanning speed which ranges from ten to several thousands mm/s. Therefore, the processing time can be shortened. This is because the galvanometer mirror and the polygon mirror are lightweight so that the rapid scanning can be performed.

A solid laser such as a YVO$_4$ laser, a YAG laser, a YLF laser, a YAlO$_3$ laser, or an Ar laser can be used in an apparatus for emitting an energy beam output continuously (a CW laser irradiation apparatus). The energy beam output continuously can be irradiated using the beam emitted from any of these lasers. In addition, the harmonic of these lasers can be also employed.

Although the laser beam may have any shape, the laser beam is preferably processed to be linear through an optical system. It is noted that "linear" here does not mean a line strictly, but means a rectangle having a high aspect ratio (or an oblong shape). For example, the linear beam indicates the rectangular beam having an aspect ratio of 10 or more (preferably in the range of 100 to 10000). For example, the linear beam spot has a length ranging from 150 to 1000 μm in its major axis and a length ranging from 5 to 20 μm in its minor axis. With the laser beam shaped into linear, it is possible to perform the process having high throughput.

It is noted that after the object to be irradiated and the laser beam are relatively moved to process one line, they are moved so as to process the next line and then the process starts. Such a relative movement is repeated to process a large-sized substrate. Therefore, the scanning speed of the laser beam and the scanning speed of the object to be irradiated are set so as to synchronize each other. In other words, the first scanning means for changing the traveling direction (a scanning direction) of the laser beam and the second scanning means for scanning the object to be irradiated relative to the first scanning means are preferably controlled to synchronize each other.

In addition, it is preferable to arrange an fθ lens between the object to be irradiated and the scanning means in order to make the spot of the laser beam have a constant shape. It is more preferable to employ a telecentric fθ lens that can make an incidence angle constant. Although there is limit for enlarging the size of such an fθ lens, the fθ lens can process a wide range of region by scanning the object to be irradiated while moving it.

The present invention can thus provide the uniform irradiation method of the laser beam being able to irradiate the object to be irradiated only with the uniform region in the laser beam, that is, only the region that is scanned at a constant speed.

Moreover when a semiconductor film is used as the object to be irradiated, it is possible to provide the poly-crystalline TFT having uniform crystallinity and uniform electric characteristic. With such a poly-crystalline TFT equipped, advantageous effects such as uniformity of the display or enhancement of the performance can be expected in a display device such as a liquid crystal display device and a light-emitting device having a self light-emitting element and in an integrated circuit with a CPU and a memory provided.

BRIEF DESCRIPTION OF THE DRAWINGS

In the accompanying drawings:

FIG. 1 is a drawing for showing the laser irradiation apparatus of the present invention.

DETAILED DESCRIPTION OF THE INVENTION

Embodiment Mode

The present invention will be explained hereinafter by way of embodiment modes with reference to the accompanying drawings. Since the present invention can be embodied in many different modes, it is easily understood by those skilled in the art that the modes and the details of the present invention can be changed and modified in various ways. Therefore, the present invention is not limited to the description of the embodiment modes.

Embodiment Mode 1

Figure 3A:
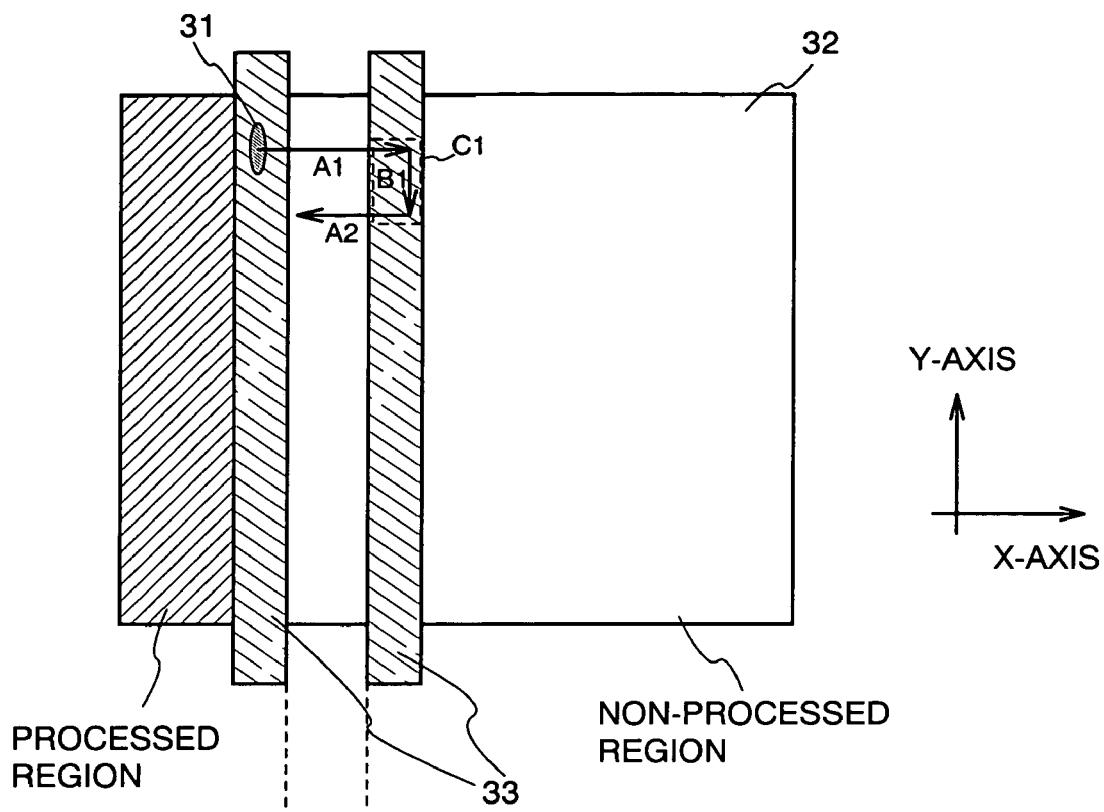
FIGS. 3A and 3B are drawings for showing the laser irradiation method of the present invention.
Figure 3B:
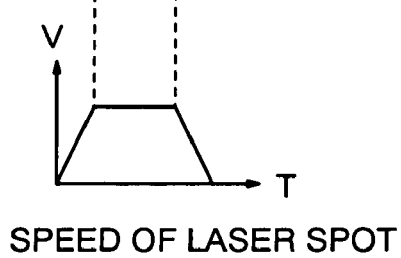

This embodiment mode explains a beam irradiation method and an apparatus for irradiating the beam (a beam irradiation apparatus) specifically with reference to FIGS. 3A and 3B.

First, as shown in FIG. 3A, a beam spot 31 is scanned on an object to be irradiated 32 by the scanning means. Initially, the beam spot 31 is scanned to a first direction of the minor axis (A1) and then the beam spot 31 is scanned to a direction of the major axis (B1). After that, the beam spot 31 is scanned to a second direction of the minor axis (A2) and then the beam spot 31 is scanned to the direction of the major axis (B1) again. When such an operation is repeated, a wide range of the object to be irradiated can be scanned with the beam spot 31. On this occasion, for example, the first scanning means scan in the direction of the minor axis and the second scanning means scan in the direction of the major axis. The second scanning means correspond to a moving of the object to be irradiated by a stage or the like.

In addition, FIG. 3B is a graph of the speed of the beam spot. In FIGS. 3A and 3B, the region where the speed of the beam spot decelerates or accelerates, and the region with the beam spot moving in the direction of the major axis, that is to say, the region C1, are shielded from the CW beam with a slit, a shutter, or the like provided between the light source and the object to be irradiated. A light-blocking plate 33 is arranged in the region to be shielded from the light in this embodiment mode. The light-blocking plate 33 is arranged near the object to be irradiated 32 in order to suppress the effect of diffraction of the beam. Preferably, the distance between the object to be irradiated 32 and the light-blocking plate 33 is 1 cm or less. And the whole irradiation object is irradiated with the beam by scanning (zigzag scanning) sequentially.

For example, when the beam spot has a size of 10 μm×500 μm, the scanning speed of the beam spot is assumed to be 500 mm/s, and the length of the region irradiated in one line in the direction of the minor axis is assumed to be 100 mm, the beam spot is scanned 100 mm for 0.2 seconds. After that, the object to be irradiated moves by the width of the irradiated region (200 μm in the direction of the major axis in this embodiment mode). On this occasion, the region to be shielded from the light (non-irradiated region) is set to 5 mm from opposite ends of the object to be irradiated, and the light-blocking plates are provided at intervals of 90 mm. Therefore when the beam spot is blocked, the object to be irradiated is moved 200 μm in the direction of the major axis by the stage or the like. With such a scanning performed, it is possible to process the whole surface of the object to be irradiated having a large size uniformly.

The light-blocking plate may have a reflector for reflecting the beam, an absorber for absorbing the beam, or the like in its structure. And the beam reflected on the reflector may be absorbed in a damper or the like. Furthermore, it is preferable to circulate water in the damper in order to prevent the damper from generating heat. In addition, the reflector to become the light-blocking plate can be formed of the metal material such as aluminum or stainless, or formed of an alloy of these materials. In addition, the absorber may be black, which is obtained by applying it with black color.

In addition, the light-blocking plate is arranged in the place that is between the object to be irradiated and the first scanning means and that is in the range where the scanning speed of the beam on the object to be irradiated changes. This light-blocking plate may be arranged in the vicinity of the scanning means or in the vicinity of the object to be irradiated. When the light-blocking plate is provided in the vicinity of the scanning means, the size of the light-blocking plate can be made small, and as a result, the irradiation apparatus can be miniaturized. In addition, it is also preferable to provide the light-blocking plate in the vicinity of the object to be irradiated because the irradiated region can be controlled precisely and moreover the effect of diffraction of the beam due to the light-blocking plate can be suppressed.

Moreover, the light-blocking plates are arranged so as to form the predetermined irradiated region. The interval may be determined in consideration of the scanning beam shape or the irradiated region. When the galvanometer mirror is employed as the first scanning means, the region irradiated with the scanning beam ranges from approximately 5 to 30 cm. When the region shielded from the light is assumed to range from approximately 0.5 to 2 cm in the opposite ends for example, the light-blocking plates are arranged at intervals ranging from 1 to 29 cm.

In addition, in the present invention, the beam and the object to be irradiated may be moved relatively. Either the beam or the object to be irradiated, or both of them may be moved. The stage moving to X-Y axis directions may be used as means for moving the object to be irradiated. An example of the means for moving the object to be irradiated can be explained as follows. A rail moving to X-axis direction and a rail moving to Y-axis direction are arranged so as to be orthogonalized each other. The object to be irradiated is fixed on the stage by means of suction or the like and then the stage is moved in X-Y axis directions along the rails. Alternatively, the object to be irradiated can be also moved to X-Y axis directions with it floated by air or the like. In addition, when the object to be irradiated is moved in the direction of the major axis of the beam spot, the stage is controlled so as to move in synchronization with the scanning of the beam.

In particular, when the polygon mirror is used as the scanning means, it is preferable to adjust the distance for moving the stage on a mirror-by-mirror basis. This is because the polygon mirror has a plurality of mirrors so that the direction to which the beam is reflected may be different in the adjacent mirrors. For example, a practitioner numbers each of the mirrors and the polygon mirror is scanned once. On this occasion, it is preferable that the practitioner understands the characteristic of the moving of each mirror so that the practitioner can set a control apparatus for controlling the stage movement based on this characteristic.

Moreover, it is preferable to irradiate the object to be irradiated (particularly a large-sized one) effectively by employing a plurality of light sources or by dividing the light. As a result, mass productivity can be enhanced drastically.

In addition, when many panels are manufactured from a large-sized substrate, the beam may be irradiated so that any panels are surely positioned between the light-blocking plates arranged in the opposite ends. When the beam is irradiated in such a way, it is possible to form the semiconductor film crystallized uniformly all over one panel. Therefore, there is no limit to the region in which a thin film transistor is provided and thereby design flexibility can be raised.

In addition, when the object to be irradiated is a semiconductor film formed over a substrate transparent to the beam, the beam may be made incident obliquely. When the beam is incident obliquely, it is possible to prevent the interference caused by the reflected light from the surface of the semiconductor film and the reflected light from the rear surface of the substrate. Moreover a damper or the like may be provided in order to deal with the reflected light. Since the damper has the characteristic to absorb the reflected light, the damper has a structure in which the cooling water is circulated in order to prevent the temperature of the barrier diffusion from rising due to the absorption of the reflected light.

The present invention can thus provide the processing method and the irradiation apparatus having high uniformity by the CW beam. When the irradiation apparatus and the processing method of the present invention are applied for crystallizing the semiconductor film, it is possible to provide a crystalline semiconductor film, that is to say, a poly-crystalline TFT having high uniformity.

Embodiment Mode 2

This embodiment mode explains a laser irradiation apparatus and a laser irradiation method using a CW laser as one mode of the beam with reference to FIG. 1. In addition, this embodiment mode explains the case where the semiconductor film is used as the object to be irradiated and the galvanometer mirror is used as the first scanning means.

First, a CW laser emitted from a laser oscillator 101 is extended long through an optical system 102 and is shaped into linear. Specifically, the laser can be shaped into linear after transmitting through a cylindrical lens and a convex lens included in the optical system 102.

After that, the laser shaped into linear (hereinafter referred to as a linear laser) is incident into the semiconductor film 106 through a galvanometer mirror 103 and an fθ lens 104. The linear laser here is adjusted so that a laser beam spot 105 having the predetermined size is formed on the semiconductor film. In addition, the fθ lens 104 can make the laser beam spot 105 have a constant shape on the surface of the object to be irradiated regardless of the angle of the galvanometer mirror.

It is noted that, in FIG. 1, the laser annealing is performed to the semiconductor film formed over the large-sized substrate having a size of 1500 mm (the length in Y-direction in the figure)×1800 mm (the length in X-direction in the figure). The diameter of the fθ lens 104 is practical in the range of approximately 100 to 300 mm, in other words, it is possible to scan in width ranging from 100 to 300 mm.

On this occasion, an apparatus (control apparatus) 110 for controlling the vibration of the galvanometer mirror controls the vibration of the galvanometer mirror. In other words, the galvanometer mirror vibrates so as to change the angle of the mirror and the laser beam spot 105 is moved to one direction (for example X-axis direction in the figure). For example, when the galvanometer mirror vibrates in half cycle, the laser beam is moved to X-axis direction on the semiconductor film by a certain width (outward).

And then, the semiconductor film moves to Y-axis direction by an XY stage 109. And the laser beam spot moves to X-axis direction on the semiconductor film by the galvanometer mirror in the same way (homeward). With such a back-and-forth movement of the laser beam, the laser beam spot is moved along the route shown with a reference numeral 107 so as to perform the laser annealing to the whole semiconductor film.

In addition, it is preferable to make the direction of the back-and-forth movement of the laser beam spot perpendicular to the direction of the major axis of the laser beam spot (X-direction in the figure) because the throughput can be enhanced. Moreover, the major axis of the laser beam spot may be set so as to have a certain angle to the direction of the back-and-forth movement, which is so-called oblique incidence. In other words, the laser beam may be incident not only in vertical direction but also in other direction.

When the laser beam is moved back and forth in this way, the speed of the laser beam spot is not constant, that is to say, the speed thereof accelerates, decelerates, or the like in the region where the galvanometer mirror 103 stops and its vicinity (including the region where the spot moves in Y-axis direction). Since it is concerned that uniformity of the laser annealing may be lowered because of such a region, the present invention provides a light-blocking plate 108 in the region where the speed of the laser beam spot is not constant so as to shield such a region from the laser beam. Thus, uniform laser irradiation can be performed.

The shape of the light-blocking plate here can be set by a practitioner appropriately. In addition, the light-blocking means is not limited to the light-blocking plate and the light-blocking means may be synchronized with the scanning means for blocking the light.

The light-blocking plate is preferably arranged near the semiconductor film in consideration of the effect of diffraction of the laser. In that case, the light-blocking plate and the semiconductor film are preferably arranged to have a distance of 1 cm or less in between.

The interval between the light-blocking plates may be set in accordance with the region irradiated with the laser determined by the shape of the laser beam spot or the fθ lens 104. For example, the light-blocking plates are set at intervals ranging from 3 to 30 cm. In addition, the width of the light-blocking plate may be determined in accordance with the distance from the scanning start position to the position where the scanning speed of the laser becomes constant. In the case of the galvanometer mirror, the width of the light-blocking plate is enough in the range of approximately 1 to 10 mm. In addition, one opening or a plurality of openings each of which has a size ranging from 3 to 30 cm may be provided in the light-blocking plate. As a result, it is possible to prevent the inhomogeneous laser annealing.

The galvanometer mirror 103 does pendulum movement at a certain frequency. As a result, the laser beam spot 105 is moved back and forth constantly. And the XY stage 109 moves by the predetermined length, and after finishing the laser annealing to one line, the XY stage 109 moves on to the next line rectangularly.

For example, the range of the semiconductor film having a size of 100 mm×200 μm (the region irradiated with the laser beam in one line in X-axis direction) is crystallized while vibrating the galvanometer mirror 103. Subsequently, the semiconductor film 106 is moved by only 200 μm with the XY stage 109 to the Y-axis direction and then the laser beam is irradiated by vibrating the galvanometer mirror 103. When this back-and-forth movement is repeated, the laser annealing can be performed to the range of one line having a size of 100 mm×1500 mm uniformly. The light-blocking plates here are arranged at intervals of 100 mm. The other region is irradiated with the laser beam in the same way so as to perform the laser annealing to the whole surface of the semiconductor film. In the case of this embodiment mode, the laser annealing can be performed to the whole surface of the semiconductor film having a size of 1500 mm×1800 mm by repeating the above process 18 times.

In addition, generally, the CW laser has high coherency. Therefore the laser beam is made incident at an angle more than 0° (oblique incidence) so that the reflected light from the rear surface of the object to be irradiated does not interfere with the reflected light from the surface of the object to be irradiated on the surface to be irradiated.

As thus described, in the present invention, even the large-sized region can be irradiated as the object to be irradiated uniformly by the CW laser, the first scanning means such as the galvanometer mirror or the polygon mirror, the second scanning means such as an XY stage, an fθ lens, and a light-blocking plate. As a result, mass productivity can be enhanced and the cost for manufacturing a semiconductor device can be reduced.

Although the galvanometer mirror is used as the first scanning means in this embodiment mode, the polygon mirror or the other mirror having a specular surface (preferably one specular surface) being able to rotate can be employed.

In addition, in the present invention, the laser annealing, that is to say, the laser processing may be performed after the semiconductor film is patterned to be a desired shape, such as an island shape, a linear shape, or a panel shape.

Embodiment Mode 3

This embodiment mode explains the case to enhance productivity of the thin film transistor by performing the laser annealing, that is, the laser processing with a plurality of laser oscillators to the semiconductor film formed over the substrate.

Figure 2A:
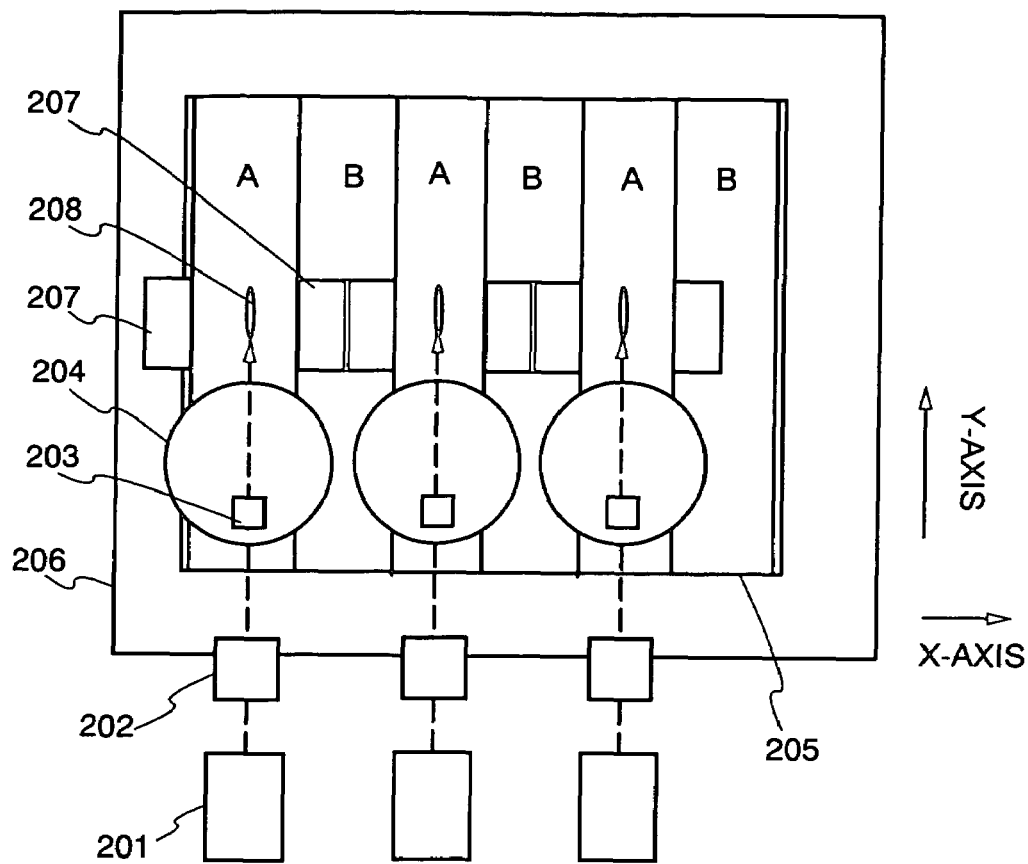
FIGS. 2A and 2B are drawings for showing the laser irradiation apparatus of the present invention.
Figure 2B:
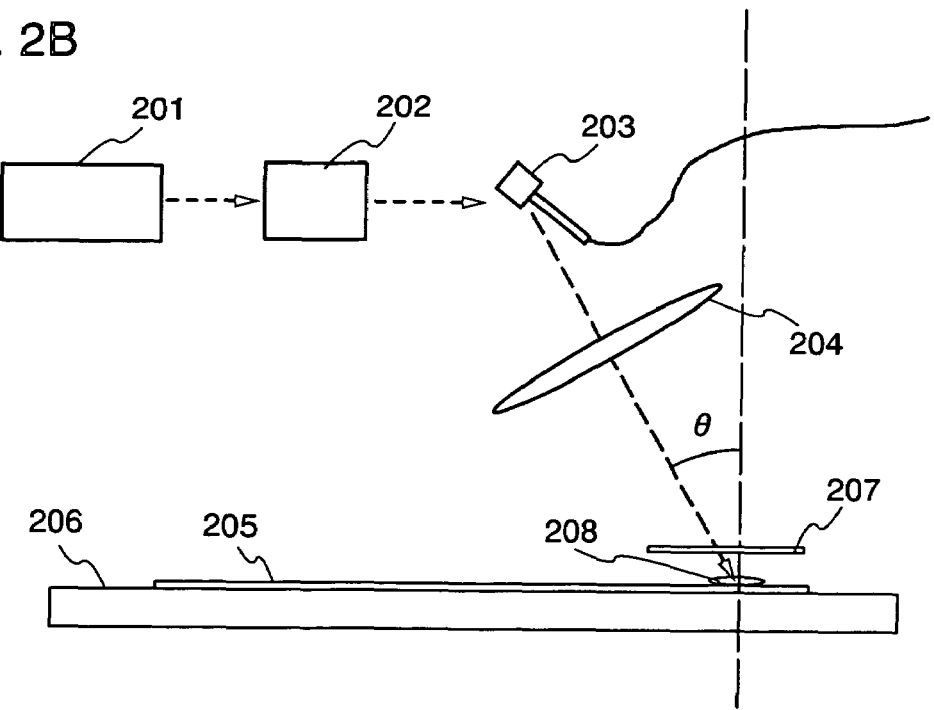

FIGS. 2A and 2B show an example to employ three laser oscillators 201, three telecentric fθ lenses 204, three galvanometer mirrors 203, and three pairs of slits 207 are employed to perform the laser annealing to the semiconductor film 205 formed over a large-sized substrate having a size of 1500 mm×1800 mm. It is noted that FIG. 2A is a top view and FIG. 2B is a side view.

An oxide film (a silicon oxide film such as SiON or $SiO_2$) is formed over a substrate as a base film and then a semiconductor film is formed thereon sequentially. The semiconductor film may be formed of the material mainly consisting of silicon with CVD, sputtering, or the like. In this embodiment mode, an amorphous silicon film is formed with the CVD using silane gas. In some film-forming methods, the semiconductor film may contain too much hydrogen to resist the laser annealing. Therefore, in order to increase the resistivity of the semiconductor film against the laser annealing, the hydrogen concentration in the semiconductor film is preferable on the order of $10^{20}/cm^3$ or less. Therefore when the film contains hydrogen more than the above value, it is preferable to dehydrogenate with the thermal annealing at a temperature ranging from approximately 400 to 500° C. for about one hour.

The laser annealing is performed to the semiconductor film formed thus. It is noted that the semiconductor film may be patterned in a desired shape before the laser annealing. For example, the second harmonic (wavelength 532 nm) of an LD pumped CW Nd: $YVO_4$ laser is used as the laser oscillator 201. The laser oscillator 201 has an output of 10 W and is $TEM_{00}$ mode. The laser beam spot has a diameter of φ2.3 mm, and has a divergence angle of 0.35 mrad.

In addition, since this wavelength is transparent to the amorphous silicon film and the substrate, it may be necessary to devise a method for suppressing the inhomogeneous laser annealing due to the interference. In that case, the laser beam may be made incident into the semiconductor film 205 at an angle more than 0°, for example. The appropriate incidence angle depends on the shape or the size of the laser beam spot. For example, when the laser beam spot shaped into a linear ellipse having a size of 400 μm in its major axis and 20 μm in its minor axis on the semiconductor film 205 is set so that the major axis thereof is included in the incidence plane, the appropriate incidence angle θ is approximately 20°. On this occasion, the direction to which the laser beam spot 208 is extended, that is to say, the direction of the major axis thereof is Y-axis direction in FIGS. 2A and 2B. Although the laser beam spot 208 may be extended in the other direction according to the purpose, it is preferable to extend the laser beam spot in Y-axis direction in order to maximize throughput in this embodiment mode.

An optical system 202 shapes the laser beam spot into linear. For example, the optical system 202 includes a planoconcave lens having a focal length of 50 mm, a planoconvex lens having a focal length of 200 mm arranged 145 mm behind the planoconcave lens, a planoconvex cylindrical lens having a focal length of 250 mm arranged 140 mm behind the planoconvex lens, and a planoconcave cylindrical lens having a focal length of 100 mm arranged 145 mm behind the planoconvex cylindrical lens. It is noted that the direction of curvature of the planoconvex cylindrical lens is the same as that of the planoconcave cylindrical lens. Moreover, a galvanometer mirror 203 is arranged approximately 250 mm behind the planoconcave cylindrical lens, and a telecentric fθ lens 204 is arranged in accordance with the specification of these lenses. In this embodiment mode, the telecentric fθ lens 204 has a focal length of approximately 300 mm and has a diameter of φ120 mm.

In the laser irradiation apparatus having the optical system as above, the laser beam spot 208 extended to be linear on the semiconductor film 205 is scanned on the semiconductor film 205 at a speed of 500 mm/s by the galvanometer mirror 203. A pair of slits 207 is provided as the light-blocking plates in the position where the laser beam spot 208 accelerates or decelerates so as to have a region to be shielded from the light, which makes it possible to irradiate the semiconductor film 205 only with the range of the beam spot scanned at a constant speed. The light-blocking plates here are arranged at intervals of 100 mm, and moreover it is preferable to make the distance between the light-blocking plate and the semiconductor film 1 cm or less in consideration of preventing the diffraction of the laser beam. In addition, since the length of several mm is enough for accelerating the galvanometer mirror, it is appropriate for the light-blocking plate to have a width of approximately several mm. In this embodiment mode, the light-blocking plate has a width of 5 mm. In other words, when the beam spot is scanned with the galvanometer mirror 203 in 110 mm range, the opposite ends thereof are cut with a pair of slits 207 by 5 mm respectively to have the region shielded from the light. When the width of a poly-crystalline region (the width of the beam spot in Y-axis direction) formed with one scanning of the galvanometer mirror determined by the spot size is assumed to be 200 μm, after the spot 208 is scanned 110 mm in X-axis direction, an XY stage 206 is moved 200 μm in Y-axis direction, and then the laser beam spot is scanned on the semiconductor film 205 with the galvanometer mirror 203 again. These are repeated to perform the laser annealing to a region A in the figure. The number of regions A corresponds to the number of laser oscillators. These regions A are formed at intervals of 100 mm. After the annealing of the region A is completed, the semiconductor film 205 is moved with the XY stage 206 to the position where a region B can be annealed. Then the laser annealing is performed to the region B as well as the region A. A series of these operations can perform the laser annealing to the whole surface of the semiconductor film 205. Of course, it is not necessary for the laser annealing to be performed to all over the semiconductor film 205 and the laser annealing may be performed only to the necessary part thereof. As a result, the processing time can be shortened. In such a case, it is necessary to make positioning mechanism and the like precisely and a practitioner may calculate the necessary precision to determine its structure appropriately.

In this embodiment mode, a plurality of telecentric fθ lenses 204 is arranged at intervals. Therefore, the semiconductor film can be irradiated with a plurality of laser beams simultaneously without the adjacent telecentric fθ lenses interfering each other. This makes it possible to obtain higher throughput compared with the case to employ only one laser oscillator. Therefore, this structure is appropriate particularly to the large-sized substrate.

In addition, although this embodiment mode employs the fθ telecentric lens in order for the laser beam to be incident into the semiconductor film at a constant angle, an fθ lens may be used instead.

The semiconductor film is thus crystallized. After that, the semiconductor film is patterned in the predetermined shape in accordance with requirement a gate insulating film, a gate electrode, and an impurity region are formed and then activation is performed. The laser irradiation apparatus and the laser irradiation method of the present invention can be also applied to activate the semiconductor film. Sequentially, an interlayer insulating film, a source wiring, a drain wiring, a pixel electrode and the like are formed and thus an active matrix substrate having a plurality of thin film transistors is formed. In addition, the active matrix substrate can be utilized for forming a liquid crystal display device, a light-emitting device, the other display device having a display portion, a semiconductor integrated circuit, or the like.

As above, when a plurality of the laser oscillators are used to perform the laser annealing, mass productivity of a thin film transistor can be enhanced.

In addition, although this embodiment mode employs a plurality of laser oscillators, one laser beam emitted from one laser oscillator may be divided into a plurality of spots with a mirror or the like.

Moreover, although this embodiment mode employs the galvanometer mirror as the first scanning means as mentioned above, a polygon mirror or a mirror having a specular surface (preferably one specular surface) being able to rotate can be also employed.

Embodiment Mode 4

Figure 4A:
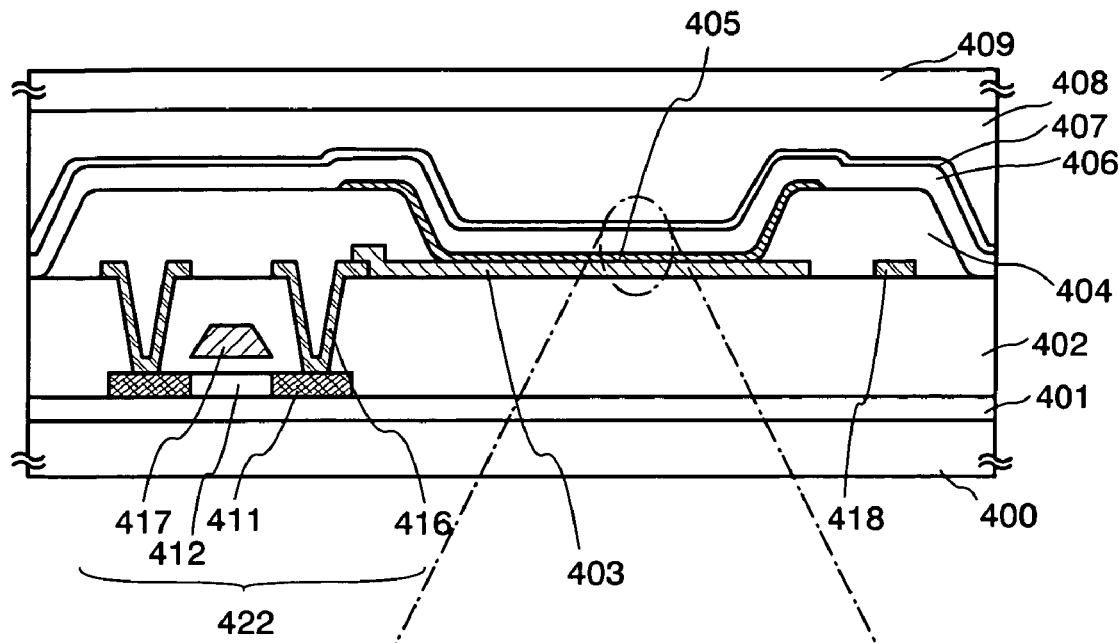
FIGS. 4A and 4B are drawings for showing the light-emitting device formed using the laser irradiation method of the present invention.
Figure 4B:
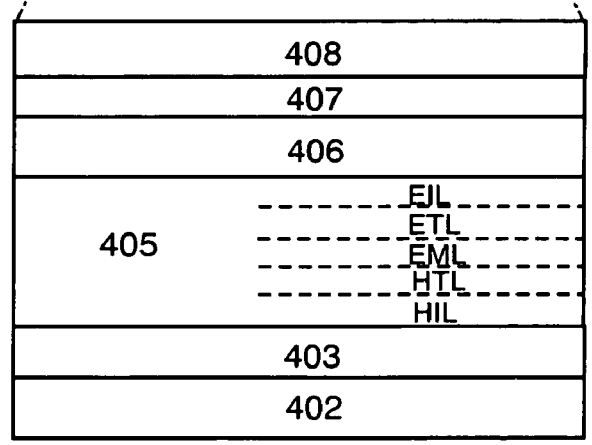

This embodiment mode explains a light-emitting device manufactured using the active matrix substrate with reference to FIGS. 4A and 4B.

FIG. 4A shows a cross section of the light-emitting device, specifically an EL module. In addition, FIG. 4B is an enlarged view of the laminated-layer structure of the light-emitting element (having an organic compound layer, the first conductive film and the second conductive film) of the EL module.

FIG. 4A shows a first substrate 400, a base insulating film 401, a TFT 422 having the semiconductor film annealed with the laser irradiation apparatus of the present invention, a first conductive film (electrode) 403, an insulator (also referred to as a barrier diffusion, an embankment, or a bank) 404, an organic compound layer 405, a second conductive film (electrode) 406, a protective film 407, an airspace 408, and a second substrate 409.

A glass substrate, a quartz substrate, a silicon substrate, a plastic substrate, a metal substrate, a stainless substrate, or a flexible substrate can be used as the first substrate and the second substrate. The flexible substrate is a film-like substrate formed of PET, PES, PEN, acryl, or the like, and when the flexible substrate is used to manufacture a semiconductor device, weight saving is anticipated. It is desirable to form a barrier layer such as an aluminum film (AlON, AlN, AlO, or the like), a carbon film (DLC or the like), or SiN on a surface of the flexible substrate or on both the surface and the rear surface thereof in a single layer or in multi-layers, because the durability and the resistivity against gas can be improved.

In addition, either the first conductive film or the second conductive film is formed of ITO or the like having translucency according to whether the light from the organic compound is emitted upward or downward. In addition, when the light is emitted to both upward and downward, it is preferable to have the transparent conductive film as the first conductive film and the second conductive film.

The TFT 422 (p-channel TFT) formed over the first substrate 400 is an element for controlling the current flowing through the organic compound layer 405. The TFT 422 has an impurity region 411 functioning as a drain region (or a source region), a channel-forming region 412, and a gate electrode 417 provided over the channel-forming region. Furthermore, the TFT 422 has a drain electrode (or a source electrode) 416 connected to a drain region (or a source region) and to the first conductive film 403. Moreover, a wiring 418 such as a power supplying line or a source wiring is formed simultaneously in the same process as that for forming the drain electrode 416.

A base insulating film 401 (here the base insulating film is formed of an insulating nitride film as a lower layer and an insulating oxide film as an upper layer) is formed over the first substrate 400 and the gate insulating film is provided between the gate electrode 417 and the semiconductor film. In addition, the interlayer insulating film 402 is formed so as to have an organic material or an inorganic material. Here, although it is not illustrated in the figure, one TFT or a plurality of TFTs (n-channel TFT or p-channel TFT) are also provided in one pixel. In addition, although this embodiment shows the TFT having one channel-forming region 412, there is no particular limitation, and the TFT may have a plurality of channels.

In addition, although this embodiment mode explains the example of a top gate type TFT, the present invention can be applied regardless of the TFT structure. For example the present invention can be applied to a bottom gate type (inversely staggered) TFT and a staggered TFT.

In addition, the first conductive film 403 becomes an anode (or a cathode) of the light-emitting element. When the first conductive film is formed of a transparent conductive film, ITO (alloy of indium oxide and tin oxide), alloy of indium oxide and zinc oxide ($In_2O_3$—ZnO), zinc oxide (ZnO), or the like can be used.

In addition, there is an insulator 404 (also referred to as a bank, a barrier diffusion, a blocking layer, an embankment, or the like) to cover the end portion of the first conductive film 403 (and the wiring 418). The insulator 404 can be made of an inorganic material (silicon oxide, silicon nitride, silicon oxynitride, or the like), a photosensitive or non-photosensitive organic material (polyimide, acryl, polyamide, polyimidamide, resist, or benzocyclobutene), or the layers formed by laminating these materials. It is noted that this embodiment mode uses a photosensitive organic resin covered with the silicon nitride film. For example, when the positive photosensitive acryl is used as the material of the organic resin, it is desirable that only the upper end portion of the insulator has a curved surface. In addition, the insulator may be either a negative type, which becomes insoluble in the etchant by the light, or a positive type, which becomes soluble in the etchant by the light.

In addition, the organic compound layer 405 is formed with a vapor deposition method or a coating method. In this embodiment mode, the organic compound layer is formed in a vapor deposition system to obtain uniform film thickness. In addition, in order to enhance the reliability, it is preferable to evacuate by means of vacuum heating (at a temperature ranging from 100 to 250° C.) just before forming the organic compound layer 405. For example, when the vapor deposition method is used, the film is deposited in the film-forming chamber that is vacuum pumped so that the degree of vacuum is $5\times10^{-3}$ Torr (0.665 Pa) or less, preferably in the range of $10^{-4}$ to $10^{-6}$ Pa. At the deposition, the organic compound is vaporized by heating it in advance, and it is spattered toward the substrate by opening the shutter. Vaporized organic compound is spattered upward and deposited through an opening provided in a metal mask.

In addition, as shown in FIG. 4B, the organic compound layer (the EL layer) 405 is a laminated-layer of HIL (a hole injecting layer), HTL (a hole transporting layer), EML (an emitting layer), ETL (an electron transporting layer), and EIL (an electron injecting layer) that are laminated in order from the anode side. Typically, CuPc is used as the HIL, α-NPD is used as the HTL, BCP is used as the ETL, and BCP:Li is used as the EIL.

In addition, in the case of a full color display, the materials showing the light emission of red (R), green color (G), and blue color (B) respectively as the organic compound layer (EL layer) 405 may be formed selectively with the vapor deposition method using respective deposition masks or with an ink-jetting method appropriately. It is noted that the ink-jetting method is a method to spit (jet) a droplet (also referred to as a dot) of the composition in which a material of the conductive film, the insulating film, or the like is mixed selectively. Specifically, CuPc or PEDOT is used as the HIL, α-NPD is used as the HTL, BCP or Alq$_3$ is used as the ETL, and BCP:Li or CaF$_2$ is used as the EIL. In addition, for example, Alq$_3$ doped with dopant corresponding to each color of R, G, and B (DCM or the like in the case of R, DMQD or the like in the case of G) may be used as EML. It is noted that the structure of the organic compound layer is not limited to the laminated-layer structure as above.

More specific laminated-layer structure of the organic compound layer is explained as follows. In the case of forming the organic compound layer 405 to show red light emission, after forming CuPc in 30 nm thick and forming α-NPD in 60 nm thick, the same mask is used to form Alq$_3$ with DCM$_2$ and rubrene added in 40 nm thick as a red light-emitting layer. After that BCP is formed as the electron-transporting layer in 40 nm thick, and then BCP with Li added therein is formed in 1 nm thick as the electron-injecting layer. In addition, in the case of forming the organic compound layer showing green light emission, after forming CuPc in 30 nm thick and forming α-NPD in 60 nm thick, the same deposition mask is used to form Alq$_3$ with coumarin 545T added therein in 40 nm thick as a green light-emitting layer. After that BCP is formed in 40 nm thick as the electron-transporting layer, and then BCP with Li added therein is formed in 1 nm thick as the electron-injecting layer. In addition, in the case of forming a layer including the organic compound layer showing blue light emission, after forming CuPc in 30 nm thick and forming α-NPD in 60 nm thick, the same mask is used to form bis[2-(2-hydroxyphenyl)benzoxazolate]zinc: Zn(PBO)$_2$ in 10 nm thick as a light-emitting layer. After that BCP is formed in 40 nm thick as the electron-transporting layer, and then BCP with Li added therein is formed in 1 nm thick as the electron-injecting layer.

Among the organic compound layers of these colors, CuPc and α-NPD common to all layers can be formed all over the pixel portion. In addition, the mask can be shared among these colors. For example, after forming the red organic compound layer, the mask is moved to form the green organic compound layer. Then the mask is moved again to form the blue organic compound layer. In addition, the order of the organic compound layer of each color to be formed is set appropriately.

In addition, in the case of white light emission, a full color display may be performed by providing a color filter or a color conversion layer separately. The color filter or the color conversion layer with respect to the white light emitting upward may be pasted after providing it to the second substrate. In addition, the color filter or the color conversion layer with respect to the white light emitting downward can be formed through the insulating film after forming the drain electrode (or the source electrode) 416. After that, the insulating film and the second conductive film are formed in order over the color filter or the color conversion layer and the drain electrode (or the source electrode) 416 may be connected to the second conductive film through a contact formed in the insulating film.

It is thus possible to provide a light-emitting device having highly homogeneous crystalline semiconductor film using the laser irradiation apparatus and the laser irradiation method according to the present invention. Since the inhomogeneity of the laser beam can be reduced due to the present invention, it is possible to provide the light-emitting device with the display evenness.

In addition, the active matrix substrate of the present invention can be applied to the liquid crystal display device and the other display device, and further to the semiconductor integrated circuit and CPU.

Embodiment Mode 5

The active matrix substrate manufactured by the present invention can be applied to various kinds of electronic instruments. As the electronic instrument, a personal digital assistance (mobile phone, a mobile computer, a mobile game machine an electronic book, or the like), a video camera, a digital camera, a goggles type display, a display device, a navigation system, or the like is given. FIGS. 5A to 5E show specific examples of these electronic instruments.

Figure 5A:
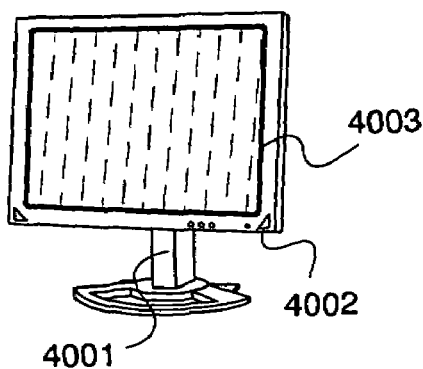
FIGS. 5A to 5E are drawings for showing the electronic instruments formed using the laser irradiation method of the present invention.

FIG. 5A is a display including a chassis 4001, a voice output portion 4002, a display portion 4003, and the like. The active matrix substrate formed by the present invention can complete the display portion 4003 having a liquid crystal material or a light-emitting element. The display device includes all the information display devices for a personal computer, for TV broadcast reception, for advertisement, and the like.

Figure 5B:
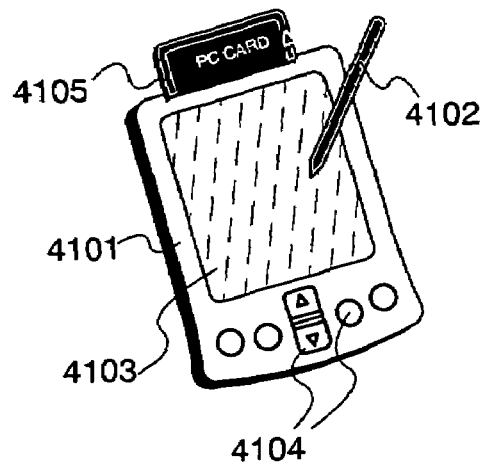

FIG. 5B is a mobile computer including a main body 4101, a stylus 4102, a display portion 4103, an operation button 4104, an external interface 4105, and the like. The active matrix substrate formed by the present invention can complete the display portion 4103 having a liquid crystal material or a light-emitting element.

Figure 5C:
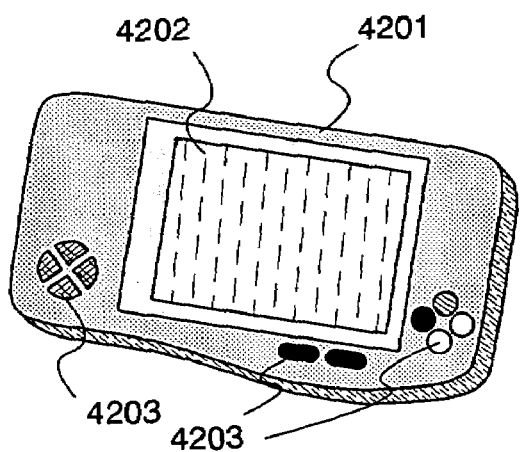

FIG. 5C is a game machine including a main body 4201, a display portion 4202, an operation button 4203, and the like. The active matrix substrate formed by the present invention can complete the display portion 4202 having a liquid crystal material or a light-emitting element.

Figure 5D:
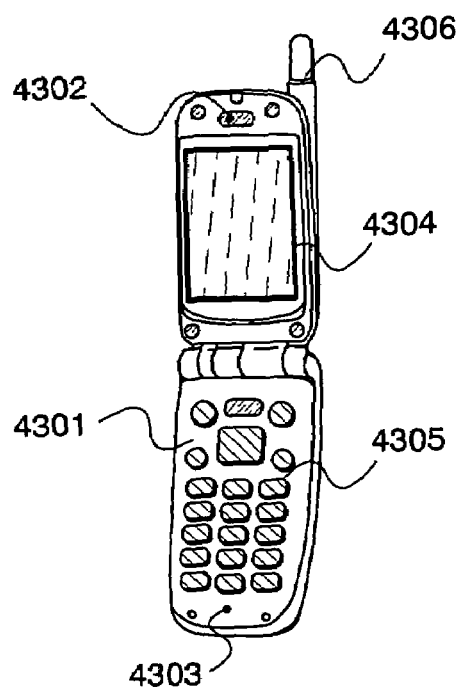

FIG. 5D is a mobile phone including a main body 4301, a voice output portion 4302, an voice input portion 4303, a display portion 4304, an operation switch 4305, an antenna 4306, and the like. The display portion 4304 having a liquid crystal material or a light-emitting element can be completed with the active matrix substrate formed by the present invention.

Figure 5E:
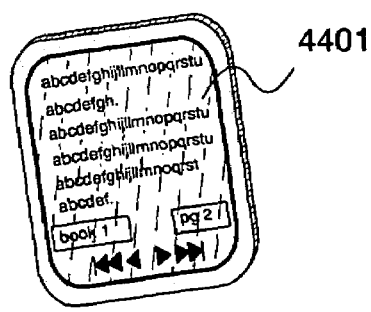

FIG. 5E is an electronic book reader including a display portion 4401 and the like. The display portion 4202 having a liquid crystal material or a light-emitting element can be completed with the active matrix substrate formed by the present invention.

As above, the present invention can be applied in a wide range, and can be applied to the electronic instruments in every field. In particular, it is possible to make the electronic instruments lightweight and thin when the flexible substrate is used as the insulating substrate of the active matrix substrate

Embodiment Mode 6

The present invention is applied not only to the CW beam but also to the energy beam output in a pulse oscillation (a pulsed beam, particularly referred to as a pulsed laser when using the laser as the light source), which has the same advantageous effect provided that a crystal grain grown continuously toward the scanning direction can be obtained by determining the oscillation frequency so that the next pulsed laser light is irradiated within the period from the time the semiconductor film is melted with the laser light until the semiconductor film is solidified. In other words, the present invention may employ a pulsed beam in which the lower limit in the period of a pulse oscillation (oscillation frequency) is determined so that the period of a pulse oscillation becomes shorter than the period from the time the semiconductor film is melted until the semiconductor film is solidified. For example, the specific oscillation frequency of the pulsed laser using the laser as the light source is set to 10 MHz or more, which is considerably higher than that of the pulsed laser to be used usually having an oscillation frequency in the range of several tens to several hundreds Hz.

The reason why the present invention employs the pulsed laser having such high frequency is explained as follows. When a pulsed laser is employed, it is said that it takes several tens to several hundreds nsec to solidify the semiconductor film completely after the semiconductor film is irradiated with the laser beam. With the pulsed laser light having a frequency of 10 MHz or more applied thereto, it is possible to irradiate the next pulsed laser beam within the period from the semiconductor film is melted by the laser light until the semiconductor film is solidified. Therefore, unlike the case using the conventional pulsed laser, the interface between the solid phase and the liquid phase can be moved continuously in the semiconductor film and thereby the semiconductor film having a crystal grain grown continuously toward the scanning direction is formed. Specifically, it is possible to form an aggregation of crystal grains, each of which has a width ranging from 10 to 30 μm in the scanning direction, a width ranging from 1 to 5 μm in the direction perpendicular to the scanning direction, which is the crystal grain as large as that formed with the CW laser. It is also possible to form a semiconductor film having almost no crystal grain boundary at least in the channel direction of TFT by forming a crystal grain of a single crystal extended long along the scanning direction.

When the oscillation at the frequency described above is assumed to be possible, a beam emitted from an Ar laser, a Kr laser, an excimer laser, a $CO_2$ laser, a YAG laser, a $Y_2O_3$ laser, a $YVO_4$ laser, a YLF laser, a $YalO_3$ laser, a glass laser, a ruby laser, an alexandrite laser, a Ti: Saphire laser, a copper vapor laser, or a gold vapor laser can be used.

For example, it is possible to use the $YVO_4$ laser having an energy of 2 W, an oscillation mode of $TEM_{00}$, the second harmonic (532 nm), an oscillation frequency of 80 MHz, and a pulse width of 12 psec. Moreover, a pulsed laser irradiation apparatus having this laser oscillator can be used. In addition, the beam spot can be shaped into a rectangular spot having a size of 10 μm in its minor axis and 100 μm in its major axis on the surface of the semiconductor film through the optical system. When the oscillation frequency is set to 80 MHz, the interface between the solid phase and the liquid phase can be moved continuously and thereby the crystal grain grown continuously toward the scanning direction is formed. It is thus possible to form a semiconductor film having almost no crystal grain boundary at least in the channel direction of TFT by forming a crystal grain of a single crystal extended long along the scanning direction.

In other words, in the case of using either the CW laser beam or the pulsed laser beam, in the present invention, the laser beam is blocked when the scanning speed of the beam spot is not the predefined value.

Advantageous Effect of the Invention

Uniform processing can be performed by using the scanning means of the present invention in which the light-blocking plate is arranged in the range where the scanning speed of the laser beam scanned on the object to be irradiated is not constant. As a result, it is possible to prevent the object to be irradiated, particularly the semiconductor film, from being peeled. In addition, the laser irradiation method and the like of the present invention are appropriate for performing the laser annealing to the semiconductor film formed over the large-sized substrate.

What is claimed is:
1. A method for manufacturing a thin film transistor comprising:
   forming a crystalline semiconductor film by irradiating with an energy beam while scanning the energy beam;
   forming a gate electrode over the crystalline semiconductor film; and
   forming an impurity region in the crystalline semiconductor film using the gate electrode as a mask,
   wherein the energy beam is blocked by means for blocking the energy beam in a position in which a scanning direction of the energy beam changes, and
   wherein the means for blocking the energy beam is a light-blocking plate provided over the crystalline semiconductor film so as to have a distance of 1 cm or less in between.
2. A method for manufacturing a thin film transistor according to claim 1, wherein the energy beam is output continuously from a laser.
3. A method for manufacturing a thin film transistor comprising:
   forming a crystalline semiconductor film by irradiating with an energy beam while scanning the energy beam;
   forming a gate electrode over the crystalline semiconductor film; and
   forming an impurity region in the crystalline semiconductor film using the gate electrode as a mask,
   wherein the energy beam is blocked by means for blocking the energy beam in a position where a scanning of the energy beam starts and in a position where the scanning thereof ends, and
   wherein the means for blocking the energy beam is a light-blocking plate provided over the crystalline semiconductor film so as to have a distance of 1 cm or less in between.
4. A method for manufacturing a thin film transistor according to claim 1 or 3, wherein the energy beam is scanned by using a galvanometer mirror or a polygon mirror.
5. A method for manufacturing a thin film transistor comprising:
   forming a crystalline semiconductor film by using a beam irradiation apparatus, the beam irradiation apparatus comprising means for scanning an energy beam from one end to the other end, and means for blocking the energy beam in the one end and in the other end;
   forming a gate electrode over the crystalline semiconductor film; and
   forming an impurity region in the crystalline semiconductor film by using the gate electrode as a mask,
   wherein the means for blocking the energy beam is a light-blocking plate provided over the crystalline semiconductor film so as to have a distance of 1 cm or less in between.
6. A method for manufacturing a thin film transistor according to claim 5, wherein a galvanometer mirror is used as the means for scanning the energy beam.
7. A method for manufacturing a thin film transistor according to claim 5, wherein the energy beam is output continuously from a laser.
8. A method for manufacturing a thin film transistor comprising:
   forming a crystalline semiconductor film by using a beam irradiation apparatus, the beam irradiation apparatus comprising means for scanning an energy beam from one end to the other end, and means for blocking the energy beam in the one end and in the other end in synchronization with the means for scanning;

forming a gate electrode over the crystalline semiconductor film; and forming an impurity region in the crystalline semiconductor film by using the gate electrode as a mask, wherein the means for blocking the energy beam is a light-blocking plate provided over the crystalline semiconductor film so as to have a distance of 1 cm or less in between.

9. A method for manufacturing a thin film transistor according to claim 8, wherein a galvanometer mirror is used as the means for scanning the energy beam.

10. A method for manufacturing a thin film transistor according to claim 8, wherein the energy beam is output continuously from a laser.

11. A method for manufacturing a thin film transistor comprising:

forming a crystalline semiconductor film by using a beam irradiation apparatus, the beam irradiation apparatus comprising a plurality of means for scanning a plurality of energy beams from one end to the other end, and a plurality of means for blocking the energy beams in the one end and in the other end;

forming a gate electrode over the crystalline semiconductor film; and forming an impurity region in the crystalline semiconductor film by using the gate electrode as a mask, wherein the means for blocking the energy beam is a light-blocking plate provided over the crystalline semiconductor film so as to have a distance of 1 cm or less in between.

12. A method for manufacturing a thin film transistor according to claim 11, wherein a galvanometer mirror is used as the means for scanning the energy beam.

13. A method for manufacturing a thin film transistor according to claim 11, wherein the energy beam is output continuously from a laser.

14. A method for manufacturing a thin film transistor comprising:

forming a crystalline semiconductor film by using a beam irradiation apparatus, the beam irradiating apparatus comprising means for scanning an energy beam from one end to the other end, and means for blocking the energy beam in the one end and in the other end, wherein the means for scanning has a specular body having a plane surface or a curved surface, wherein the specular body is fixed to a shaft so as to be arranged on an optical axis of the energy beam, and wherein the specular body vibrates by using the shaft as its center;

forming a gate electrode over the crystalline semiconductor film; and forming an impurity region in the crystalline semiconductor film using the gate electrode as a mask, wherein the means for blocking the energy beam is a light-blocking plate provided over the crystalline semiconductor film so as to have a distance of 1 cm or less in between.

15. A method for manufacturing a thin film transistor according to claim 14, wherein a galvanometer mirror is used as the means for scanning the energy beam.

16. A method for manufacturing a thin film transistor according to claim 14, wherein the energy beam is output continuously from a laser.

17. A method for manufacturing a thin film transistor comprising:

forming a crystalline semiconductor film by using a beam irradiation apparatus, the beam irradiating apparatus comprising means for scanning an energy beam from one end to the other end, and means for blocking the energy beam in the one end and in the other end, wherein the means for scanning has a specular body having a plane surface or a curved surface, wherein the specular body is fixed to a shaft so as to be arranged on an optical axis of the energy beam, and wherein the specular body rotates by using the shaft as its center;

forming a gate electrode over the crystalline semiconductor film; and forming an impurity region in the crystalline semiconductor film using the gate electrode as a mask, wherein the means for blocking the energy beam is a light-blocking plate provided over the crystalline semiconductor film so as to have a distance of 1 cm or less in between.

18. A method for manufacturing a thin film transistor according to claim 17, wherein a galvanometer mirror is used as the means for scanning the energy beam.

19. A method for manufacturing a thin film transistor according to claim 17, wherein the energy beam is output continuously from a laser.

20. A method for manufacturing a thin film transistor according to any one of claims 1, 3 and 5 to 17, wherein the thin film transistor is incorporated into at least one selected from the group consisting of a display, a mobile computer, a game machine, a mobile phone, and an electronic book reader.

21. A method for manufacturing a thin film transistor according to any one of claims 5 to 17, wherein the energy beam is a beam emitted from a laser selected from the group consisting of a $YVO_4$ laser, a YAG laser, a YLF laser, a $YAlO_3$ laser and an Ar laser.

* * * * *